(12) United States Patent
Pham

(10) Patent No.: US 6,812,735 B1
(45) Date of Patent: Nov. 2, 2004

(54) MULTIPLE VALUE SELF-CALIBRATED TERMINATION RESISTORS

(75) Inventor: Hiep The Pham, Campbell, CA (US)

(73) Assignee: Silicon Bridge, Inc., Fremont, CA (US)

( * ) Notice: Subject to any disclaimer, the term of this patent is extended or adjusted under 35 U.S.C. 154(b) by 75 days.

(21) Appl. No.: 10/397,496

(22) Filed: Mar. 26, 2003

(51) Int. Cl.[7] .................. H03K 17/16; H03K 19/003
(52) U.S. Cl. ............................................. 326/30; 326/24
(58) Field of Search ............................. 326/30, 23, 24; 327/322, 404, 566; 333/22 R; 338/195

(56) References Cited

U.S. PATENT DOCUMENTS

| | | | | |
|---|---|---|---|---|
| 4,972,098 A | * | 11/1990 | Boudewijns | ................ 327/566 |
| 5,617,064 A | * | 4/1997 | Gorecki | ..................... 333/22 R |
| 5,757,264 A | * | 5/1998 | Petit | ............................. 338/195 |
| 5,955,911 A | * | 9/1999 | Drost et al. | ................. 327/404 |
| 6,356,106 B1 | * | 3/2002 | Greeff et al. | ................. 326/30 |
| 6,414,512 B1 | * | 7/2002 | Moyer | ......................... 326/30 |

\* cited by examiner

*Primary Examiner*—Patrick Wamsley
(74) *Attorney, Agent, or Firm*—William L Paradice, III (57) ABSTRACT

A termination resistor circuit includes a first and second passive resistive elements coupled in series between a common mode voltage and a signal node, and a plurality of active resistive elements coupled in parallel with the first passive resistive element. The active resistive elements may be selectively enabled by corresponding control signals to provide various numbers of parallel resistances across the first passive resistive element, thereby tuning the termination resistor circuit to a desired resistance value.

20 Claims, 8 Drawing Sheets

MULTIPLE VALUE SELF-CALIBRATED TERMINATION RESISTORS

FIELD OF INVENTION

The present invention relates generally to integrated circuits and specifically to termination resistor circuits.

DESCRIPTION OF RELATED ART

Figure 1:
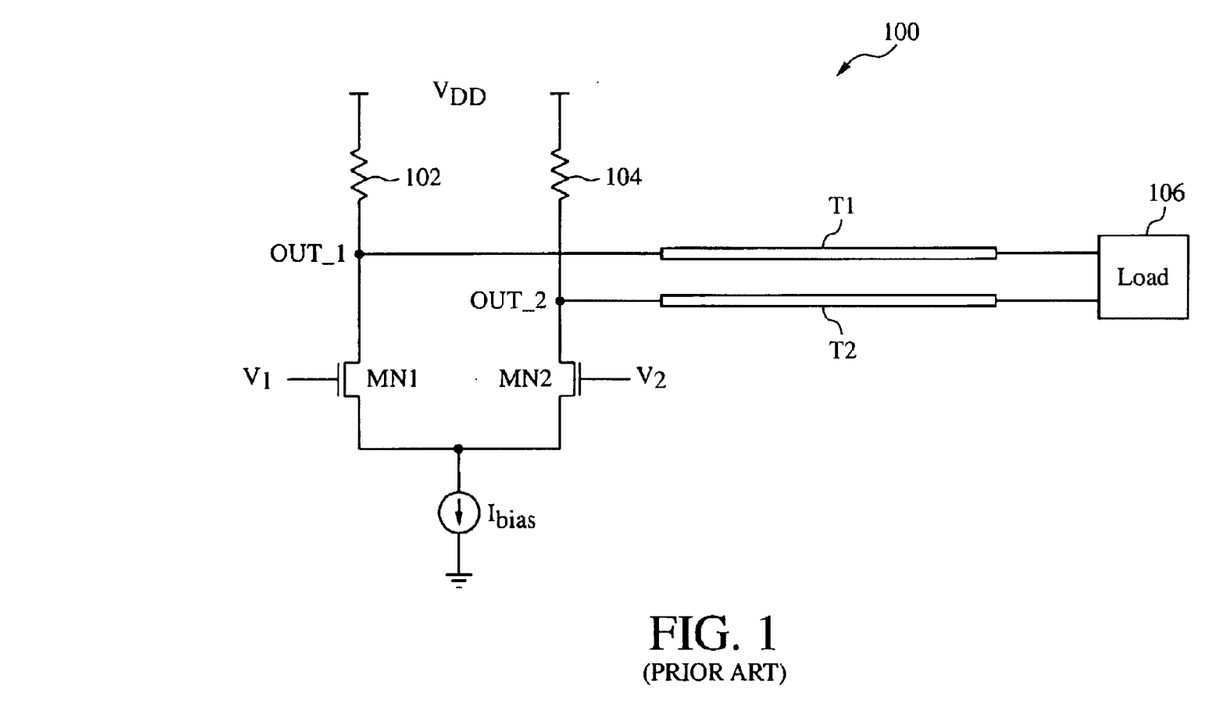
FIG. 1 is a circuit diagram of a driver circuit having conventional passive termination resistors.

Output driver circuits for driving cables which interconnect integrated circuits (ICs) are well-known. For example, FIG. 1 shows a well-known driver 100 fabricated using CMOS technology. NMOS transistors MN1 and MN2 form a differential pair which, in response to a differential voltage signal $V_2$-$V_1$, steers a bias current $I_{bias}$ between terminating resistors 102 and 104, respectively, to produce a differential output signal between output nodes OUT_1 and OUT_2. Resistor 102 sets the minimum voltage at node OUT_1, and thus controls the voltage swing at node OUT_1. Similarly, resistor 104 sets the minimum voltage at node OUT_2, and thus controls the voltage swing at node OUT_2. The output signals on output nodes OUT_1 and OUT_2 may be used to drive a load 106 via transmission lines T1 and T2, which have a characteristic impedance $Z_T$ of between 50 ohms and 300 ohms.

To minimize signal reflections on transmission lines T1 and T2, terminating resistors 102 and 104, as well as the resistance of load 106, is chosen to match the characteristic impedance $Z_T$ of transmission lines T1 and T2. Typically, resistors 102 and 104 are passive resistive elements such as, for example, polysilicon thin film resistors. However, because of process variations inherent in the fabrication of semiconductor circuits (e.g., imprecise doping and photolithographic techniques), as well as temperature-dependent operating characteristics, such passive resistors may vary as much as 20%, which may be unacceptable for some communication applications.

Figure 2:
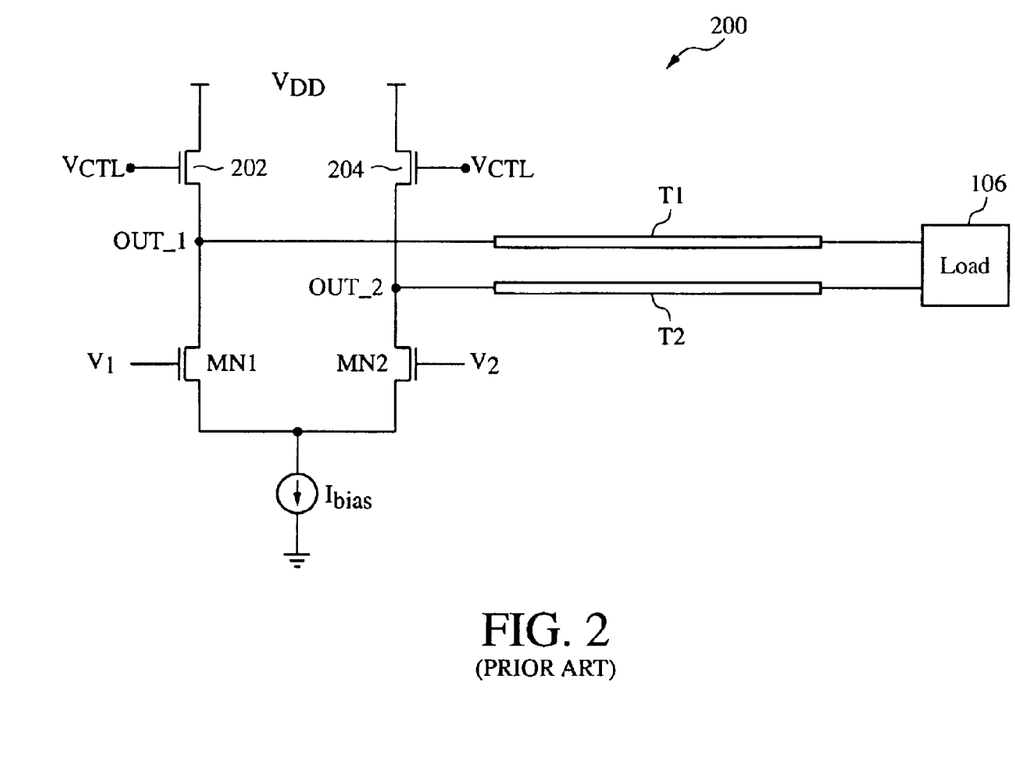
FIG. 2 is a circuit diagram of a driver circuit having conventional active termination resistors.

For improved precision, passive resistors 102 and 104 may be replaced by active resistive elements such as, for example, NMOS transistors 202 and 204, as shown in FIG. 2. As well-known in the art, resistive transistors 202 and 204 are operated in the triode region as voltage-controlled resistances having gates to receive a control voltage $V_{CTL}$. However, although more accurate than polysilicon resistors 102/104, transistors 202 and 204 may vary as much as 10% because of process and temperature variations. In addition, the p/n junctions within transistors 202 and 204 (e.g., source/well and drain/well junctions) may add significant capacitance loading to output nodes OUT_1 and OUT_2, which in turn undesirably limits circuit speed.

Accordingly, there is a need for precise termination resistors fabricated using current CMOS processes that are insensitive to temperature and process variations and which have a minimal impact upon circuit speed. In addition, for applications where the characteristic impedance of the transmission lines is not known, it would be desirable for a user to be able to change the value of the termination resistors.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

In accordance with the present invention, a driver circuit is disclosed that includes adjustable, self-calibrating termination resistors that are insensitive to process and temperature variations. In the following description, exemplary embodiments are described in order to provide a thorough understanding of the present invention. For purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be a bus. Further, the logic states of various signals described herein are exemplary and therefore may be reversed or otherwise modified as generally known in the art. Accordingly, the present invention is not to be construed as limited to specific examples described herein but rather includes within its scope all embodiments defined by the appended claims.

Figure 3:
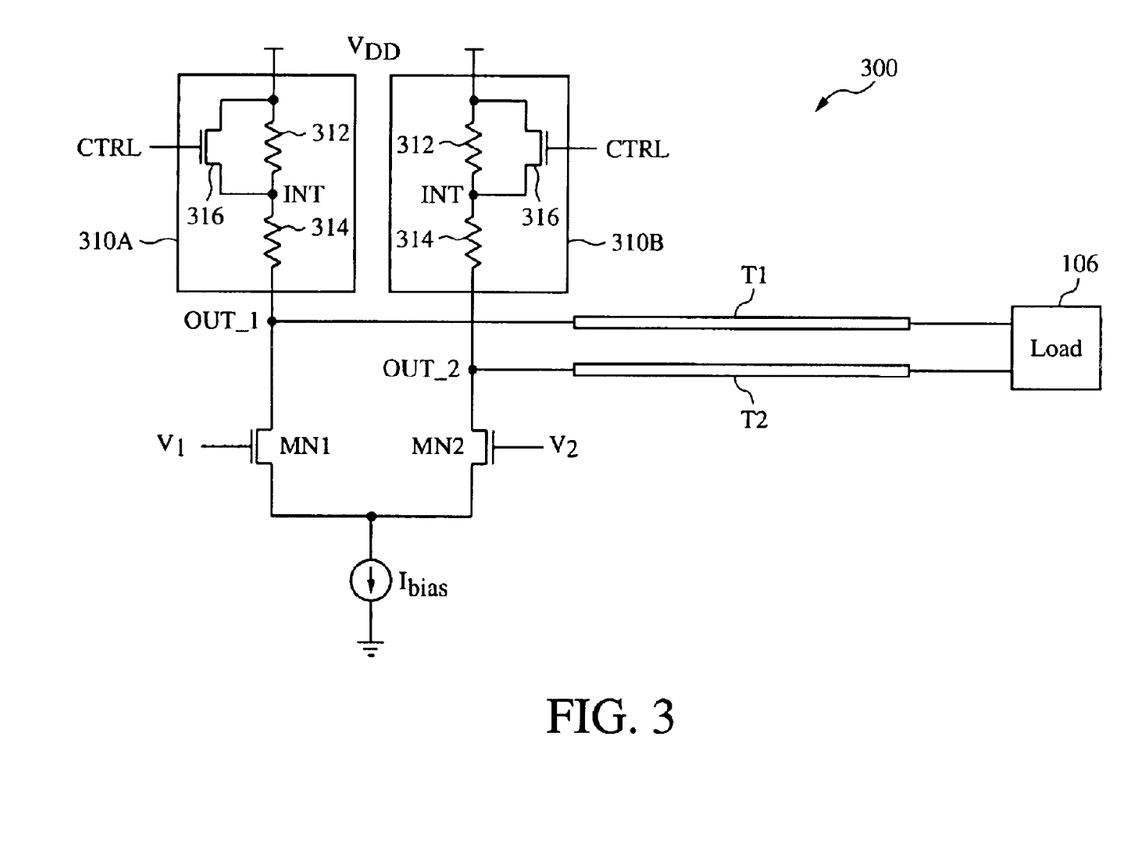
FIG. 3 is a circuit diagram of a driver circuit having termination resistor circuits in accordance with one embodiment of the present invention.

FIG. 3 shows a driver circuit 300 having termination resistor circuits 310A and 310B (collectively referred to herein collectively as resistor circuits 310) in accordance with one embodiment of the present invention. Each termination resistor circuit 310 includes first and second passive resistive elements 312 and 314 connected in series between a common mode voltage (e.g., the supply voltage $V_{DD}$ serves as the common mode voltage $V_{CM}$ for the exemplary embodiment of FIG. 3) and an output node OUT (although for other embodiments OUT may be any suitable signal node), and also includes an active resistive element 316 coupled in parallel with the first passive resistive element 312. For some embodiments, passive resistors 312 and 314 are well-known polysilicon thin film resistors, although other passive resistors may be used. Also, for the embodiment of FIG. 3, active resistors 316 are shown as NMOS transistors, although other active resistors may be used, including PMOS transistors, CMOS gates, and the like.

Transistors 316 are operated in the triode region as voltage-controlled resistances (also referred to herein as resistive transistors), wherein the resistance of transistor 316 is controlled by a voltage control signal CTRL. Thus, as described in detail below, the tuning control signal CTRL may be adjusted to tune the resistance of termination resistor circuit 316 to a desired value.

In accordance with the present invention, the coupling of active resistor 316 in parallel with passive resistor 312 provides several advantages over the prior art. First, the resistance of resistor circuit 310 is provided primarily by the passive resistors 312 and 314, while active resistor 316 provides a small, adjustable resistance for tuning resistor circuit 316. In this manner, the resistance of termination resistor circuit 310 is more linear than prior art active resistors 102/104 of FIG. 1 and prior art active resistors 202/204 of FIG. 2, and is thus more precisely controllable.

Second, by placing active resistor 316 across only a portion of the passive resistor 312/314, i.e., in parallel with passive resistor 312 but not passive resistor 314, parasitic capacitances resulting from the p/n junction(s) of transistor 316 are introduced at an intermediate node INT between resistors 312 and 314, rather than at the output node. As a result, the effect of the junction capacitance of transistor 316 upon the speed of output signals at nodes OUT_1 and OUT_2 may be significantly reduced, thereby increasing speed over prior art drivers 100 and 200.

The reduction of parasitic capacitances from transistors 316 at the output nodes may be controlled by adjusting the relative resistances of resistors 312 and 314. For example, in one embodiment in which resistor 312 has a resistance of X ohms and resistor 314 has a resistance of 2X ohms, then the voltage swing at intermediate node INT will be X/(X+2X)=⅓ of the voltage swing at the output node, as given by the well-known voltage divider rule. As a result, the parasitic capacitance introduced by transistor 316 upon the output node will be ⅓ less than if transistor 316 were connected directly to the output node, as is the case for prior art driver 200 of FIG. 2. Of course, for other embodiments, the resistance ratio between resistors 312 and 314 may he any suitable value.

In addition, passive resistor 314 may also serve as a current limiting device for driver 300. Specifically, by creating a voltage drop between the drain of transistor 316 and the output node, resistor 314 sufficiently limits the drain voltage of transistor 316 during inadvertent voltage spikes at the output node to prevent junction breakdown, thereby preventing failure of transistor 316. In this manner, passive resistor 314 makes resistor circuit 310 more durable and thus more reliable.

Figure 4:
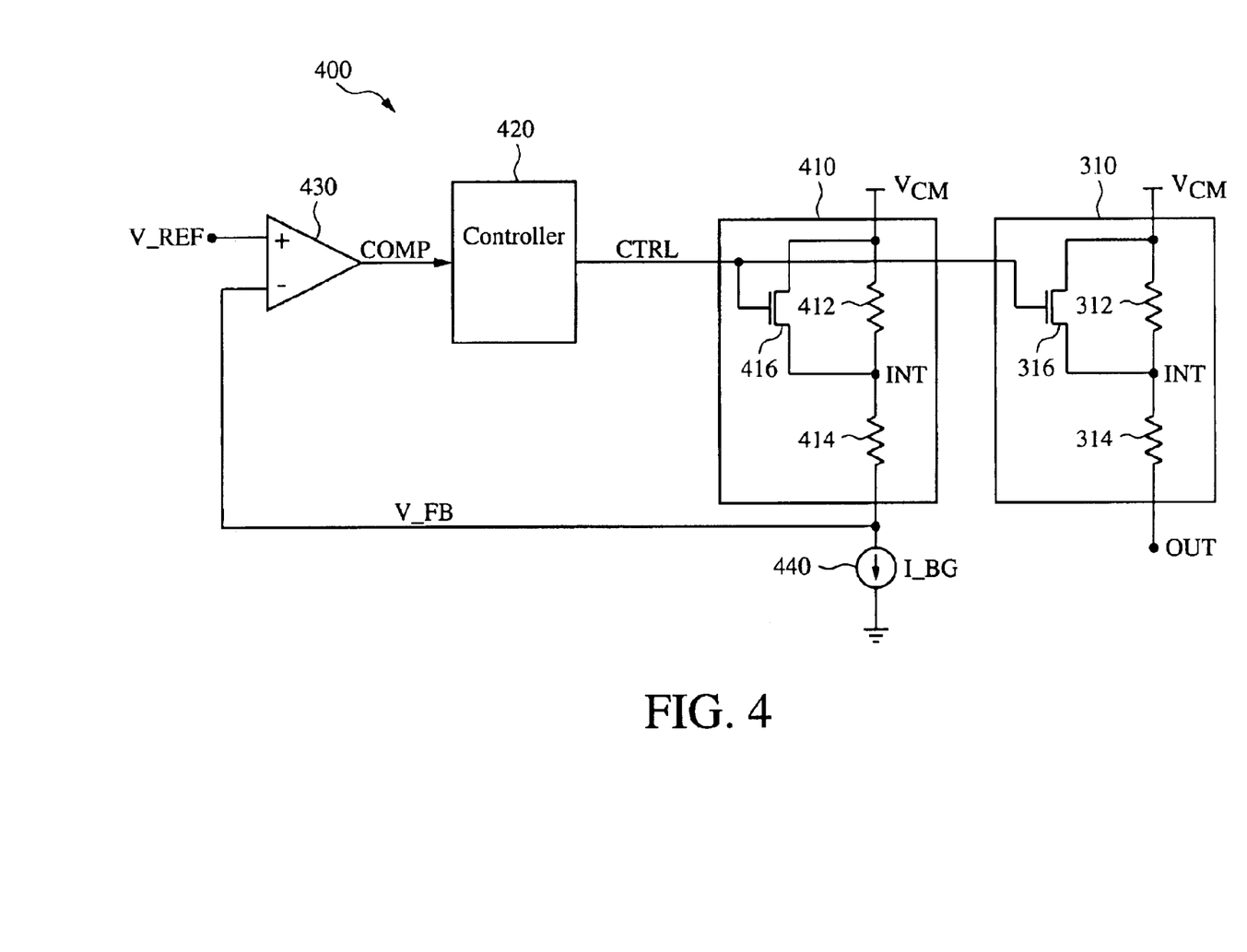
FIG. 4 is a simplified block diagram of one embodiment of a control circuit for the termination resistor circuit of FIG. 3.

FIG. 4 shows a simplified embodiment of a control circuit 400 that may be used to generate the control signal CTRL that tunes termination resistor circuit 310 to the desired value. Control circuit 400 includes a replica resistor circuit 410, a controller 420, a comparator 430, and a bandgap current source 440. Replica resistor circuit 410, which is a copy of and therefore models termination resistor circuit 310, includes passive resistors 412 and 414 and an active resistor 416. Thus, passive resistors 412 and 414 are the same as passive resistors 312 and 314, respectively, and NMOS transistor 416 is the same size as NMOS transistor 316. As a result, the resistance of termination resistor circuit 310 (R_310) tracks the resistance of replica resistor circuit 410 (R_410). Current source 440 models a constant bandgap current I_BG that is insensitive to temperature and process variations. This bandgap current I_BG, which may be generated in a well-known manner, for example, by providing a bandgap reference voltage across a precise, external resistor and mirroring the resulting current as I_BG, sets up a feedback voltage V_FB across replica resistor circuit 410, where V_FB=I_BG*R_410.

Comparator 430 is well-known, and includes a first input to receive a fixed reference voltage V_REF, a second input to receive V_FB, and an output to provide a compare signal COMP. The reference voltage V_REF may be generated using any well-known technique. For some embodiments, V_REF is a well-known ratioed bandgap reference voltage. Controller 420 is well-known, and adjusts the value of CTRL in response to COMP to manipulate the current flow through transistor 416 until the resistance of replica resistor circuit 410 is tuned to the desired value. Specifically, controller 420 and comparator 430 work together to adjust CTRL until V_FB equals V_REF, at which point replica resistor circuit 410 (and thus also termination resistor circuit. 310) are tuned to the desired value. Because control circuit 400 tunes termination resistor circuit 310 by adjusting the magnitude of current flow through transistor 316, the embodiment of FIG. 4 may be described as an analog implementation of one embodiment of the present invention.

Although effectively reducing parasitic capacitances at the output nodes, termination resistor circuit 310 is tuned by adjusting the magnitude of the voltage control signal CTRL, which may not provide sufficient tuning resolution for some applications. Thus, for other embodiments of the present invention, the termination resistor circuit may include a plurality of selectable, active resistors coupled in parallel with the first passive resistor. The plurality of active resistors may be individually enabled by a digital controller to more precisely tune the resistance of the termination resistor circuit.

Figure 5:
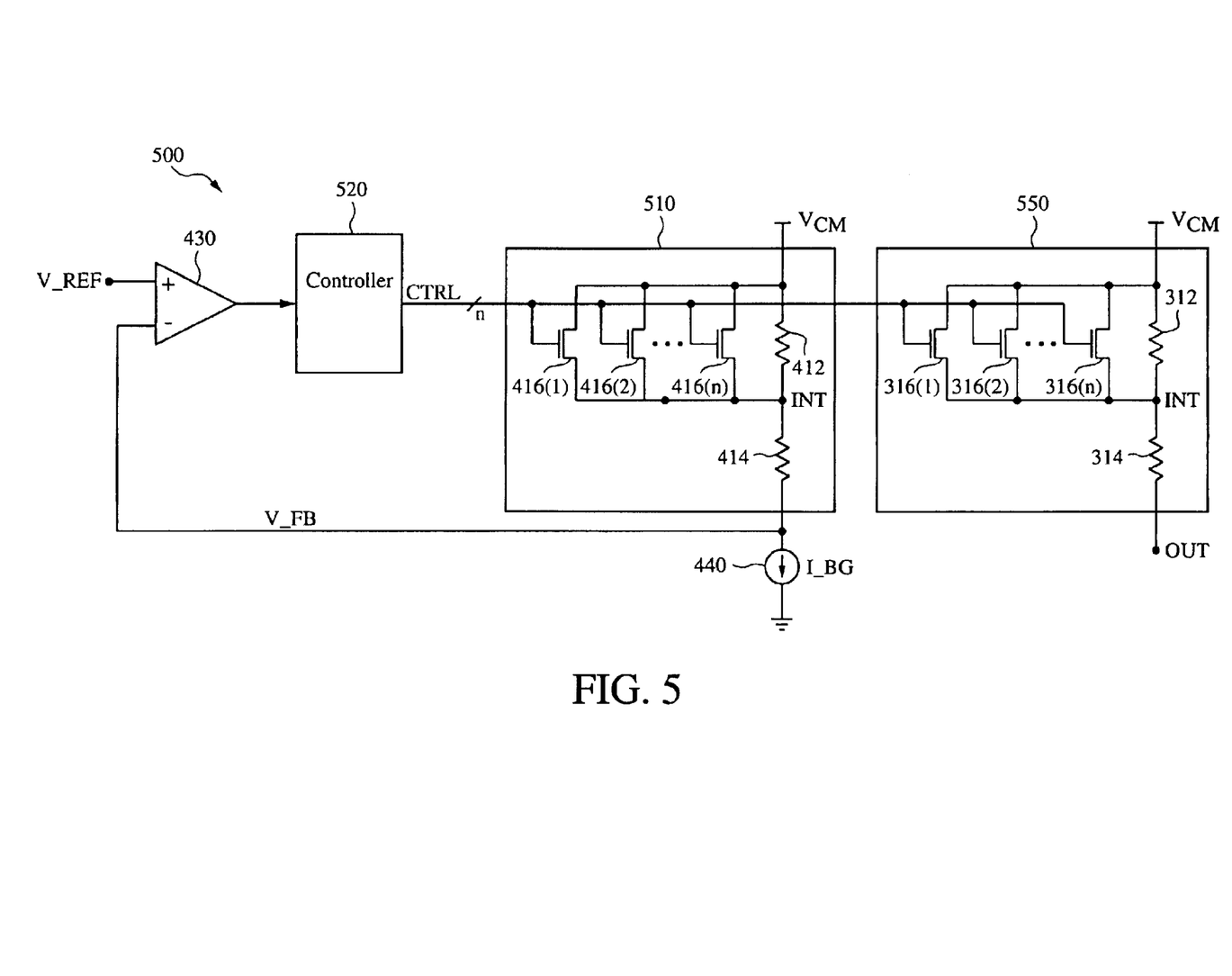
FIG. 5 is a simplified circuit diagram of a termination resistor circuit and corresponding control circuit for another embodiment of the present invention.

For example, FIG. 5 shows a termination resistor circuit 550 and a corresponding control circuit 500 in accordance with another embodiment of the present invention. Termination resistor circuit 550 includes a plurality of resistive transistors 316(1)–316(n) connected in parallel with passive resistor 312. Each resistive transistor 316 of termination resistor circuit 550 may be individually enabled or disabled by a corresponding control bit of CTRL provided by control circuit 500.

Control circuit 500 includes a replica resistor circuit 510 and a controller 520, as well as the comparator 430 and modeled bandgap current source 440 described above with respect to FIG. 4. Replica resistor circuit 510, which includes a plurality of resistive transistors 416(1)–416(n) coupled in parallel with passive resistor 412, is a copy of and therefore models termination resistor circuit 550. Thus, passive resistors 412 and 414 are the same as passive resistors 312 and 314, respectively, and NMOS transistors 416(1)–416(n) are the same size as corresponding NMOS transistors 316(1)–316(n). As a result, the resistance of termination resistor circuit 550 (R_550) tracks the resistance of replica resistor circuit 510

Controller 520 is well-known, and includes a state machine and a counter (not shown in FIG. 5 for simplicity) which together selectively assert the control bits CTRL(1)–CTRL(n) to tune resistor circuits 510 and 550 to the desired value. Specifically, comparator 430 generates COMP in response to the difference between V_REF and V_FB, and controller 520 selectively asserts CTRL(1)–CTRL(n) in response to COMP to selectively turn on or off corresponding transistors 416(1)–416(n) and 316(1)–316(n), respectively, until V_REF equals V_FB, at which point R_510 (and thus R_550) are tuned to the desired value. Accordingly, control bit CTRL(1) selectively enables corresponding transistors 316(1) and 416(1), control bit CTRL (2) selectively enables corresponding transistors 316(2) and 416(2), and so on, where control bit CTRL(n) selectively enables corresponding transistors 316(n) and 416(n).

In operation, if COMP indicates that V_REF is less than V_FB, comparator 430 generates a negative value COMP, which in turn causes controller 520 to assert one of the control bits CTRL to turn on a corresponding transistor 416 (and also a corresponding transistor 316). The enabling of transistor 416 adds a parallel path across passive resistor 412, thereby reducing R_510, which in turn reduces V_FB. Further reductions in R_510 (and thus also R_550) are similarly achieved by asserting additional control bits CTRL to turn on additional corresponding transistors 416 (and thus also additional corresponding transistors 316).

Conversely, if COMP indicates that V_REF is greater than V_FB, comparator 430 generates a positive value COMP, which in turn causes controller 520 to de-assert one of the control bits CTRL to turn off a corresponding transistor 416 (and thus also a corresponding transistor 316). The disabling of transistor 416 removes a parallel path across passive resistor 412, thereby increasing R_510, which in turn increases V_FB. Further increases in R_510 (and thus also R_550) are similarly achieved by de-asserting additional control bits CTRL to remove additional paths across passive resistor 412. When V_REF equals V_FB, comparator 430 generates a zero value COMP, which in turn causes controller 520 to latch the collective states of the control bits CTRL(1)–CTRL(n) (i.e., because replica resistor circuit 510 and termination resistor circuit 550 are tuned to the desired value).

Because control circuit 500 tunes termination resistor circuit 550 by selectively enabling or disabling transistors 316(1)–316(n) in response to corresponding control bits CTRL(1)–CTRL(n), the embodiment of FIG. 5 may be described as a digital implementation of one embodiment of the present invention. In this manner, R_550 may be precisely tuned by selectively providing varying numbers of parallel paths via transistors 316(1)–316(n) across passive resistor 312.

Figure 6:
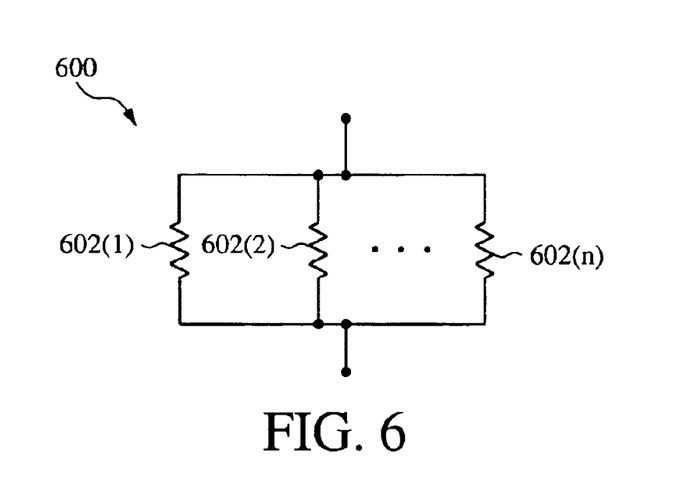
FIG. 6 is a circuit diagram for one embodiment of the passive resistive elements of the termination resistor circuits of FIGS. 3 and 5.
Figure 7:
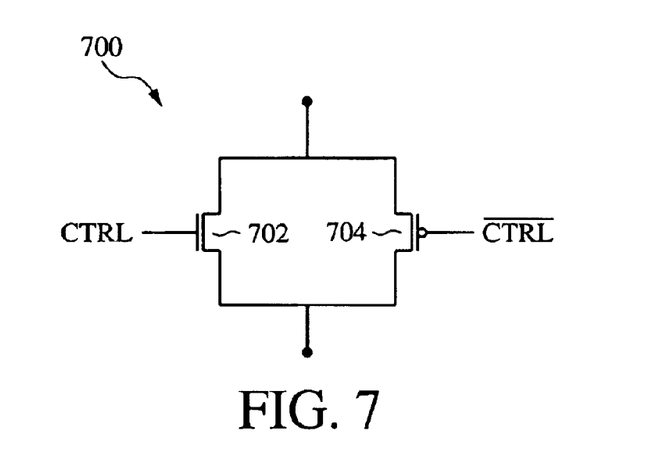
FIG. 7 is a circuit diagram for one embodiment of the active resistive elements of the termination resistor circuits of FIGS. 3 and 5.

For the exemplary embodiments described above, passive resistors 312 and 314 are illustrated as single resistive elements, and active resistors 316 and 416 are illustrated as single NMOS transistors. However, in actual embodiments, passive resistors 312 and/or 314 (and thus corresponding replica passive resistors 412 and/or 414) may include any number of polysilicon resistors coupled in parallel, and active resistors 316 (and thus active resistors 416) may be CMOS pass gates. For example, FIG. 6 shows a resistor network 600 that is one embodiment of passive resistors 312/314 and 412/414, and which includes a plurality of parallel-connected polysilicon thin film resistors 602(1)–602(n) or the like. Further, FIG. 7 shows a CMOS gate 700 that is one embodiment of resistive transistor 316 or 416, and which includes an NMOS transistor 702 connected in parallel with a PMOS transistor 704, where the gate of NMOS transistor 702 receives the control signal CTRL and the gate of PMOS transistor 704 receives the complement signal $\overline{CTRL}$.

Figure 8:
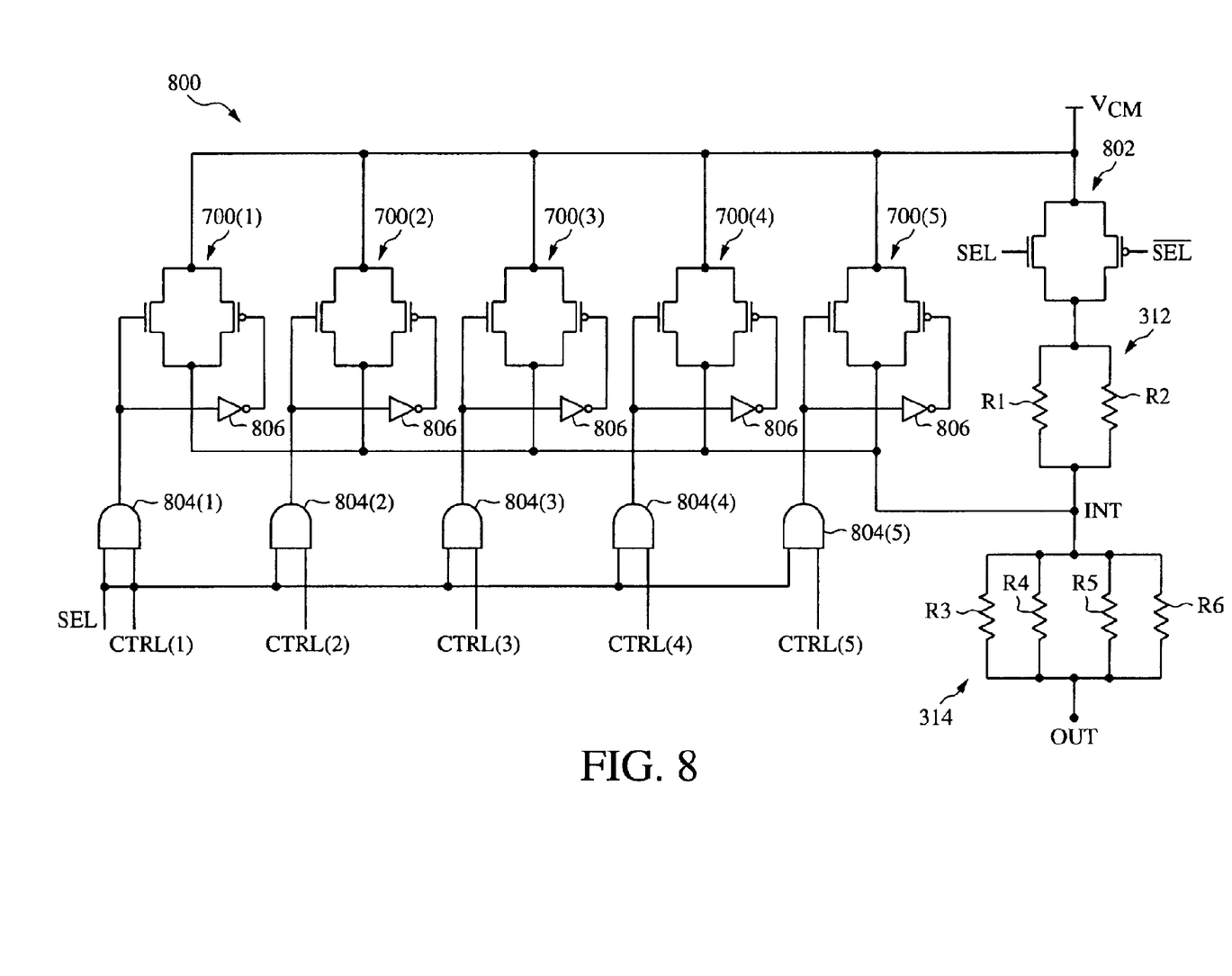
FIG. 8 is a circuit diagram for an actual embodiment of the termination resistor circuit of FIG. 5.

FIG. 8 is a circuit diagram of an actual embodiment 800 of termination resistor circuit 500. Termination resistor circuit 800 includes passive resistor 312 and a CMOS enable gate 802 coupled in series between a common mode voltage $V_{CM}$ and the intermediate node INT. Passive resistor 312 includes 2 parallel-connected polysilicon resistors R1 and R2, and CMOS enable gate 802 includes an NMOS transistor having a gate to receive a select signal SEL and a PMOS transistor having a gate to receive $\overline{SEL}$. Passive resistive element 314 is connected between node INT and node OUT, and includes 4 parallel-connected polysilicon resistors R3, R4, R5, and R6.

For some embodiments, SEL is a user-generated control signal, while for other embodiments, SEL is a fixed control signal. For one embodiment, SEL is stored in a suitable memory device associated with resistor circuit 800. For another embodiment, SEL is provided to resistor circuit 800 upon power-up.

For the active resistive element, five CMOS pass gates 700(1)–700(5) are coupled in parallel with passive resistor 312 and CMOS enable gate 802. Each of CMOS pass gates 700(1)–700(5) is controlled by the logic AND combination of SEL and a corresponding one of control bits CTRL(1)–CTRL(5). The logic combination of SEL and corresponding control bits CTRL(1)–CTRL(5) is provided by AND gates 804(1)–804(5), respectively, where the output of each AND gate 804 is provided to the NMOS transistor gate of the corresponding CMOS pass gate 700, and the complement of the output of each AND gate 804 is provided to the PMOS transistor gate of the corresponding CMOS pass gate 700 via inverter 806. For some embodiments, inverters 806 are CMOS inverters, although other logic inversion circuits may be used.

Termination resistor circuit 800 may be tuned to a desired resistance value by selectively enabling or disabling CMOS pass gates 700(1)–700(5) with corresponding control signals CTRL(1)–CTRL(5), respectively, when SEL is asserted to logic high. Specifically, when SEL is asserted to logic high, CMOS enable gate 802 is turned on, thereby connecting passive resistor 312 to $V_{CM}$. The asserted logic high state of SEL allows the outputs of AND gates 804(1)–804(5) to be controlled by the logic states of corresponding control bits CTRL(1)–CTRL(5), respectively, which may be selectively asserted by an embodiment of control circuit 500 (as described above with respect to FIG. 5) to selectively turn on or off corresponding CMOS pass gates 700(1)–700(5), respectively, and thereby tune termination resistor circuit 800 to the desired value.

Further, SEL may be used to disable resistor circuit 800. For example, when SEL is de-asserted to logic low, the output of AND gates 804 are forced to a logic low state to turn off corresponding CMOS pass gates 700, irrespective of the control bits CTRL. The de-asserted logic low state of SEL also turns off CMOS enable gate 802, which isolates passive resistor 312 from $V_{CM}$. Accordingly, with CMOS enable gate 802 and CMOS pass gates 700 turned off, the output node OUT is isolated from the common mode voltage $V_{CM}$, thereby opening resistor circuit 800.

For some embodiments where the desired resistance value of resistor circuit 800 is 300 ohms, each of resistors R1 and R2 is a 420 ohm polysilicon thin film resistor having a length of 5.0 microns and a width of 4.90 microns, each of resistors R3–R6 is a 480 ohm polysilicon thin film resistor having a length of 5.0 microns and a width of 5.86 microns, and CMOS enable gate 802 includes an NMOS transistor having a channel length of 0.18 microns and a channel width of 5.25 microns and a PMOS transistor having a channel length of 0.18 microns and a channel width of 14.17 microns. For one of such embodiments, CMOS gates 700(1) and 700(2)

include two NMOS transistors each having a channel length of 0.3 microns and a channel width of 1.75 microns and two PMOS transistors each having a channel length of 0.3 microns and a channel width of 4.9 microns, CMOS gate 700(3) includes an NMOS transistor having a channel length of 0.58 microns and a channel width of 1.75 microns and a PMOS transistor having a channel length of 0.58 microns and a channel width of 4.9 microns, CMOS gate 700(4) includes an NMOS transistor having a channel length of 1.2 microns and a channel width of 1.75 microns and a PMOS transistor having a channel length of 1.2 microns and a channel width of 4.9 microns, and CMOS gate 700(5) includes an NMOS transistor having a channel length of 2.58 microns and a channel width of 1.75 microns and a PMOS transistor having a channel length of 2.58 microns and a channel width of 4.9 microns. For these embodiments, resistor circuit 800 may be tuned to within 5% of the desired 300 ohm value for a 0.13 micron fabrication process having a 20% variation for polysilicon resistors. Further, the non-linearity of this embodiment of resistor circuit 800 is less than 2%.

Figure 9:
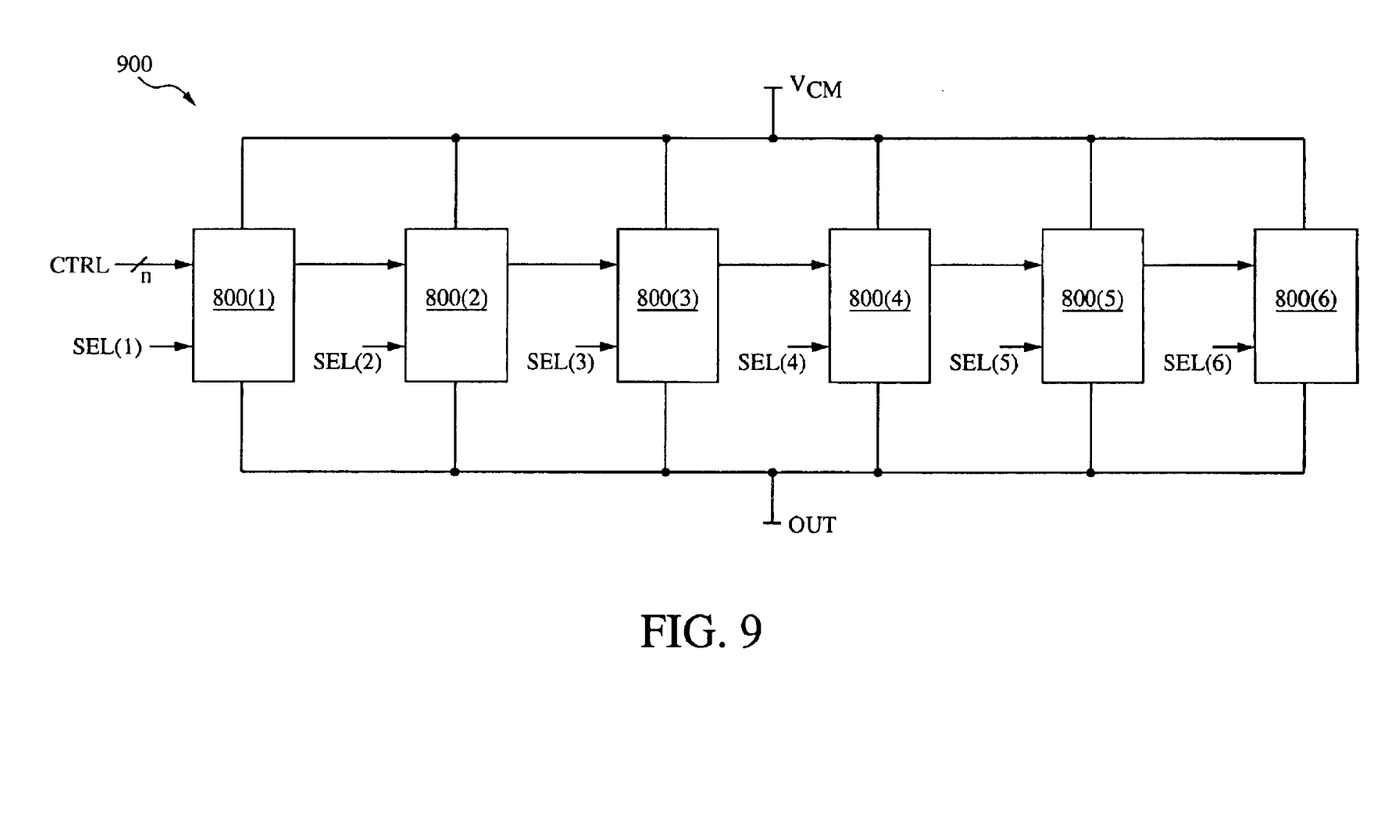
FIG. 9 is a block diagram of a termination resistor circuit in accordance with yet another embodiment of the present invention.

For other embodiments of the present invention, a plurality of resistor circuits 800 may be selectively connected in parallel to achieve various desired resistance values. For example, FIG. 9 shows a termination resistor circuit 900 for another embodiment of the present invention. Termination resistor circuit 900 is shown to include six resistor circuits 800(1)–800(6) coupled in parallel between $V_{CM}$ and OUT, although other numbers of resistor circuits 800 may be included. Further, although described above with respect to FIG. 8 as including five CMOS pass gates 700, for the embodiment of FIG. 9 each termination resistor circuit 800 may include any number of CMOS pass gates 700.

Each of resistor circuits 800(1)–800(6) includes first terminals to receive n control bits CTRL(1)–CTRL(n) (e.g., from an embodiment of control circuit 500), and includes a second terminal to receive a corresponding select signal SEL. The select signals SEL(1)–SEL(5) may be either user generated signals or fixed signals.

Termination resistor circuit 900 may be precisely tuned to any one of a number of predetermined resistance values by selectively enabling various numbers of termination resistor circuits 800(1)–800(6) using corresponding select bits SEL(1)–SEL(5), respectively. Specifically, the desired resistance value for termination resistor circuit 900 may be increased by enabling more of resistor circuits 800 in parallel with each other and, conversely, may be decreased by enabling less of resistor circuits 800 in parallel with each other. For example, for one embodiment in which each termination resistor 800 is precisely tuned to 300 ohms using the control bits CTRL as described above, termination resistor circuit 900 may be configured to have a resistance of 50 ohms by enabling all six resistor circuits 800(1)–800(6), configured to have a resistance of 60 ohms by enabling five of the resistor circuits 800(1)–800(6), configured to have a resistance of 75 ohms by enabling four of resistor circuits 800(1)–800(6), configured to have a resistance of 100 ohms by enabling three of resistor circuits 800(1)–800(6), configured to have a resistance of 150 ohms by enabling two of resistor circuits 800(1)–800(6), and configured to have a resistance of 300 ohms by enabling only one of resistor circuits 800(1)–800(6). In this manner, termination resistor circuit 900 may be precisely matched to a variety of load and/or transmission line conditions, thereby allowing for increased flexibility, for example, for applications in which the characteristic impedance of a transmission line is not known.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. For example, although described below with respect to an exemplary driver circuit, termination resistor circuits described herein may be used in other integrated circuits.

What is claimed is:

1. A termination circuit for providing a self-calibrating resistance, comprising:
    a resistor circuit, comprising:
        a first passive resistive element connected between a common mode voltage and an intermediate node;
        a second passive resistive element connected between the intermediate node and a signal node; and
        an active resistive element connected in parallel with the first passive resistive element, the active resistive element having a control terminal to receive a control signal; and
    a control circuit for generating the control signal, the control signal for tuning the resistance of the resistor circuit to a desired value.

2. The termination circuit of claim 1, wherein the active resistive element includes a plurality of parallel-connected CMOS pass gates, each comprising:
    an NMOS transistor connected between the common mode voltage and the intermediate node, and having a gate to receive a corresponding bit of the control signal; and
    a PMOS transistor connected between the common mode voltage and the intermediate node, and having a gate to receive a complement of the corresponding bit of the control signal.

3. The termination circuit of claim 2, further comprising:
    a plurality of the resistor circuits coupled in parallel with one another, each further comprising a CMOS enable gate coupled between the common mode voltage and the first passive resistive element and having a control terminal to receive a corresponding select signal.

4. The termination circuit of claim 3, wherein each of the select signals enables or disables a corresponding resistor circuit.

5. The termination circuit of claim 4, wherein the select signals collectively determine a desired resistance for the termination circuit.

6. The termination circuit of claim 2, wherein the control circuit selectively asserts the control signal bits to tune the resistor circuit to the desired value.

7. The termination circuit of claim 1, wherein the first and second passive resistive elements comprise polysilicon thin film resistors.

8. The termination circuit of claim 1, wherein the control circuit comprises a bandgap reference circuit.

9. The termination circuit of claim 1, wherein the active resistive element comprises a transistor connected between the common mode voltage and the intermediate node, and having a gate to receive the control signal.

10. The termination circuit of claim 1, wherein the active resistive element includes a CMOS pass gate, comprising:
    an NMOS transistor connected between the common mode voltage and the intermediate node, and having a gate to receive the control signal; and
    a PMOS transistor connected between the common mode voltage and the intermediate node, and having a gate to receive a complement of the control signal.

11. The termination circuit of claim 1, wherein the active resistive element comprises:
   a plurality of transistors, each connected in parallel between the common mode voltage and the intermediate node, and each having a gate to receive a corresponding bit of the control signal.

12. A termination circuit for providing an adjustable, self-calibrating resistance including a plurality of resistor circuits coupled in parallel, each comprising:
   a first polysilicon resistor connected between a common mode voltage and an intermediate node;
   a second polysilicon resistor connected between the intermediate node and a signal node;
   a plurality of pass gates coupled in parallel with the first polysilicon resistor, each pass gate having a control terminal to receive a corresponding control signal; and
   an enable select circuit for selectively enabling the resistor circuit in response to a corresponding select signal.

13. The termination circuit of claim 12, further comprising a control circuit for generating the control signals.

14. The termination circuit of claim 13, wherein the control circuit comprises a bandgap reference circuit.

15. The termination circuit of claim 13, wherein the control signals selectively enable corresponding pass gates within the resistor circuits.

16. The termination circuit of claim 13, wherein the select signals selectively enable each resistor circuit.

17. The termination circuit of claim 13, wherein:
   the control signals tune each resistor circuit to a desired value; and
   the select signals select the desired value from a plurality of predetermined values.

18. A method for providing a selectable and self-calibrating resistance, comprising:
   providing a termination resistor circuit that includes a passive resistance having first and second portions with a plurality of active resistances coupled in parallel with the first portion of the passive resistance; and
   selectively enabling the active resistances in response to a plurality of control signals to tune the resistance to a desired value.

19. The method of claim 18, further comprising:
   coupling a plurality of the termination resistor circuits in parallel with each other; and
   selectively enabling the termination resistor circuits in response to a plurality of select signals to select the desired value from a plurality of predetermined values.

20. The method of claim 18, wherein the selectively enabling comprises:
   enabling a first number of the termination resistor circuits to select a first predetermined resistance value; and
   enabling a second number of the termination resistor circuits select a second predetermined resistance value that is different from the first predetermined value, wherein the first number is different than the second number.

* * * * *